United States Patent
Lin

(10) Patent No.: US 8,159,306 B2
(45) Date of Patent: Apr. 17, 2012

(54) INTEGRATED CIRCUIT WITH LOW TEMPERATURE COEFFICIENT AND ASSOCIATED CALIBRATION METHOD

(75) Inventor: Shian-Ru Lin, Mingjian Township (TW)

(73) Assignee: Realtek Semiconductor Corp., Hsinchu (TW)

( * ) Notice: Subject to any disclaimer, the term of this patent is extended or adjusted under 35 U.S.C. 154(b) by 32 days.

(21) Appl. No.: 12/816,383

(22) Filed: Jun. 15, 2010

(65) Prior Publication Data

US 2011/0001568 A1   Jan. 6, 2011

Related U.S. Application Data

(60) Provisional application No. 61/222,914, filed on Jul. 2, 2009.

(51) Int. Cl.
*H03L 7/00* (2006.01)
*H03L 1/02* (2006.01)

(52) U.S. Cl. .............. 331/44; 331/34; 331/46; 331/47; 331/176; 327/40

(58) Field of Classification Search .............. 331/34, 331/44, 46–49, 57, 65, 66, 176; 327/40, 327/42, 46
See application file for complete search history.

(56) References Cited

U.S. PATENT DOCUMENTS

| | | | | |
|---|---|---|---|---|
| 4,325,036 A | * | 4/1982 | Kuwabara | 331/176 |
| 5,831,485 A | * | 11/1998 | Nelson et al. | 331/176 |
| 6,831,523 B1 | * | 12/2004 | Pastorello et al. | 331/25 |
| 7,212,075 B2 | * | 5/2007 | Young et al. | 331/176 |
| 7,541,878 B2 | * | 6/2009 | Haiut | 331/2 |
| 2009/0146746 A1 | | 6/2009 | Unkrich et al. | |

* cited by examiner

*Primary Examiner* — Levi Gannon

(74) *Attorney, Agent, or Firm* — Thomas, Kayden, Horstemeyer & Risley, LLP

(57) ABSTRACT

An integrated circuit (IC) with a low temperature coefficient and an associated calibration method are provided to lower the effect of the environmental temperature on the IC and at the same time to maintain the small area and low power consumption of the IC. The IC includes a first circuit, a second circuit and a calibration control circuit. The first circuit has a low temperature coefficient and generates a first output. The second circuit has a high temperature coefficient and generates a second output. The calibration control circuit detects the first and second outputs, and compares the first and second outputs according to a predefined relationship therebetween so as to generate an adjusting signal. The adjusting signal is for adjusting the second circuit such that the second circuit can have the characteristic of the low temperature coefficient.

12 Claims, 3 Drawing Sheets

US 8,159,306 B2

INTEGRATED CIRCUIT WITH LOW TEMPERATURE COEFFICIENT AND ASSOCIATED CALIBRATION METHOD

CROSS REFERENCE TO RELATED APPLICATIONS

This application claims the benefit of U.S. Provisional Application No. 61/222,914, filed on Jul. 2, 2009 and entitled "Apparatus With Low Temperature Coefficient And Thereof Method", the contents of which are incorporated herein.

BACKGROUND OF THE INVENTION (a). Field of the Invention

The present invention relates to integrated circuits, and more particularly to an integrated circuit with a low temperature coefficient and an associated calibration method.

(b). Description of the Prior Arts

When designing an integrated circuit, it is desirable for the integrated circuit to have a low temperature coefficient such that the effect of the environmental temperature can be lowered to upgrade the stability and reliability of the integrated circuit. The temperature coefficient is typically denoted by the unit of ppm (i.e. parts per million), and used to indicate the variation amount of a circuit parameter (e.g. voltage, current, frequency, etc.) resulted from temperature variation. The larger/smaller variation amount of the circuit parameter means the higher/lower temperature coefficient. In particular, the effect of the temperature variation is much more evident for the system comprised of integrated circuits, e.g. the System on Chip (SoC) which is widely developed and used nowadays. However, to lower the temperature coefficient of each sub-circuit within the integrated circuit would increase the circuit complexity, and thus increase both the area and power consumption of the integrated circuit. In this situation, the cost would also be increased substantially.

SUMMARY OF THE INVENTION

An object of the present invention is to provide an integrated circuit with a low temperature coefficient and an associated calibration method which can lower the effect of the environmental temperature on the integrated circuit.

Another object of the present invention is to provide an integrated circuit with a low temperature coefficient and an associated calibration method which can improve the temperature coefficient of the integrated circuit while at the same time maintain the small area and low power consumption of the integrated circuit.

In one embodiment of the present invention, an integrated circuit is disclosed. The integrated circuit comprises a first circuit having a first temperature coefficient and generating a first output, a second circuit having a second temperature coefficient and generating a second output, and a calibration control circuit coupled to the first circuit and the second circuit, for comparing the first output and the second output according to a predefined relationship therebetween to generate an adjusting signal, wherein the first temperature coefficient is lower than the second temperature coefficient, and the adjusting signal is for adjusting the second circuit and makes the second circuit to have a characteristic of the first temperature coefficient.

In another embodiment of the invention, a calibration method used in an integrated circuit is provided. The calibration method comprises steps of: providing a first circuit which has a first temperature coefficient and generates a first output; providing a second circuit which has a second temperature coefficient and generates a second output; and adjusting the second circuit according to a predefined relationship between the first output and the second output, so as to make the second circuit to have a characteristic of the first temperature coefficient; wherein the first temperature coefficient is lower than the second temperature coefficient.

DETAILED DESCRIPTION OF THE INVENTION

The integrated circuit (IC) and the associated calibration method provided by the present invention design a certain circuit within the IC as having a low temperature coefficient, and then perform calibration on other circuits in the IC according to an output of the low temperature coefficient circuit such that the other circuits not designed as having the low temperature coefficient can obtain the characteristic of the low temperature coefficient without increasing the cost of design and manufacture. It should be noted that the low temperature coefficient circuit can be an originally-included circuit or an additional circuit in the IC. In the case of the originally-included circuit, a certain part of the IC (i.e. the originally-included circuit) is designed to have the characteristic of the low temperature coefficient. Then, other parts of the IC are calibrated based on the low temperature coefficient part of the IC. In this manner, the whole IC is given the characteristic of the low temperature coefficient without need to respectively design each part of the IC as having the low temperature coefficient, thereby substantially reducing the cost of design and manufacture.

Figure 1:
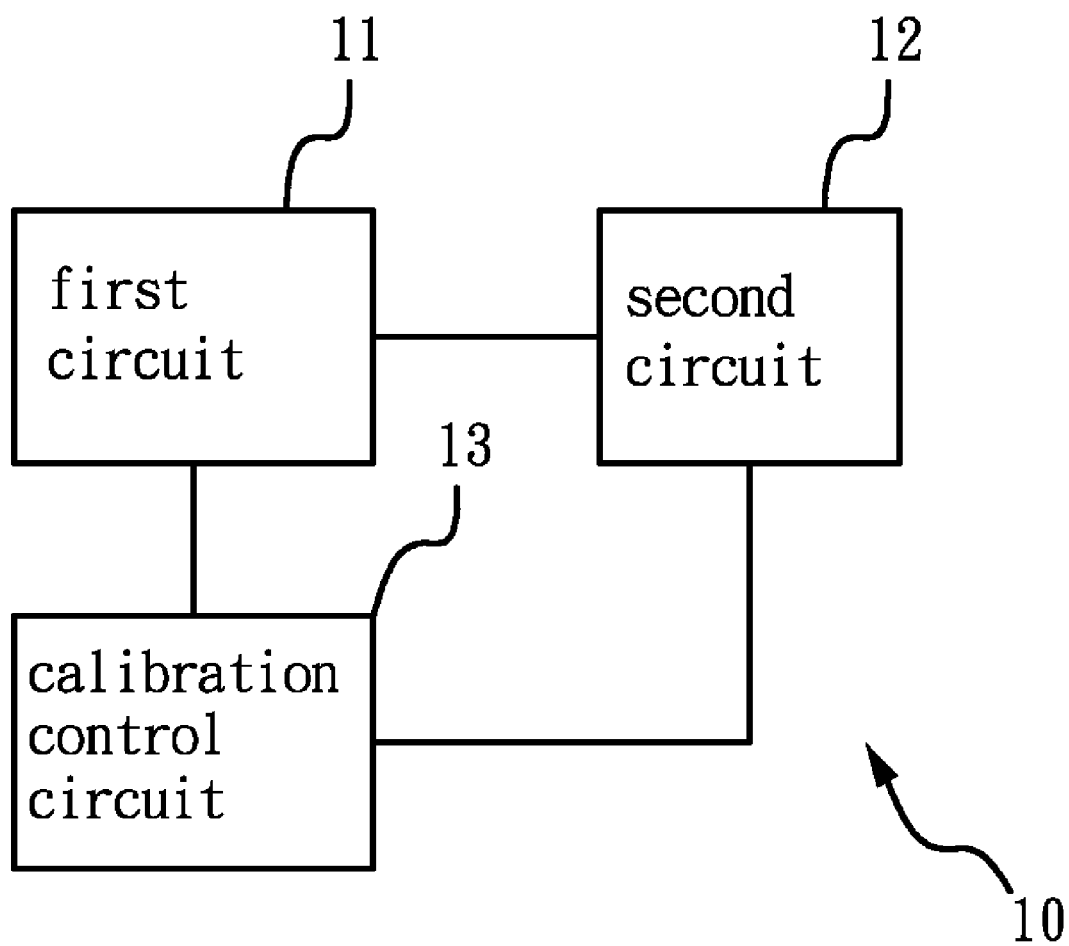
FIG. 1 is a block diagram of an embodiment of the low temperature coefficient integrated circuit according to the present invention.

FIG. 1 is a block diagram of an embodiment of the low temperature coefficient IC according to the present invention, wherein the IC 10 comprises a first circuit 11, a second circuit 12 and a calibration control circuit 13. The IC 10 can be a System on Chip (SoC), and thus the first circuit 11, the second circuit 12 and the calibration control circuit 13 are deployed on the same chip substrate. The first circuit 11 is designed as having a low temperature coefficient, and generates a first output. The second circuit 12 is not designed in such manner and thus has a higher temperature coefficient than the first circuit 11. The second circuit 12 generates a second output. The first and second outputs can be voltages, currents or other electric signals, and there is a predefined relationship (e.g. proportional relationship) between the two outputs. The calibration control circuit 13 detects the first and second outputs, and compares the two detected outputs according to the predefined relationship so as to generate an adjusting signal. Since the first circuit 11 has the low temperature coefficient, the first output would be much less influenced by the temperature variation (i.e. almost temperature-independent). Thus, when comparing the first and second outputs according to the predefined relationship, the calibration control circuit 13 would know the error of the second output resulted from the temperature variation, and then generate a corresponding adjusting signal used for adjusting the second circuit 12 to correct the error, thereby enabling the second circuit 12 to have the characteristic of the low temperature coefficient as the first circuit 11. It should be noted that although the embodiment of FIG. 1 only includes one second circuit 12, the IC 10 can include multiple second circuits 12 in other embodiments, where the multiple second circuits 12 can be respectively calibrated according to the output of the first circuit 11. In this manner, the whole IC 10 can obtain the characteristic of the low temperature coefficient without increasing the circuit area and power consumption.

Figure 2:
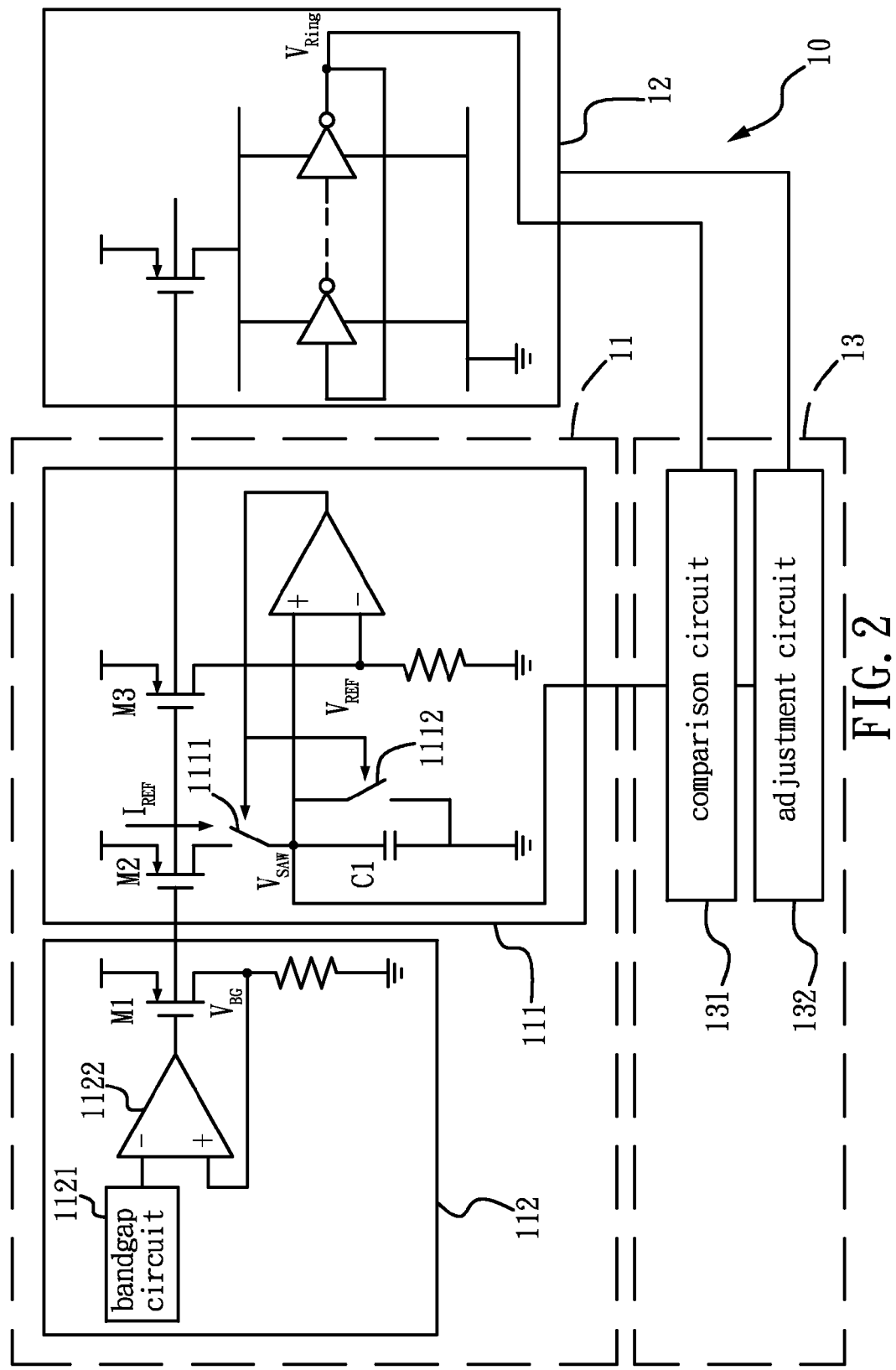
FIG. 2 is a detailed circuit diagram of an embodiment of the integrated circuit of FIG. 1.

Next, a SoC including at least two clock circuits is taken as example for further explanation of how the IC 10 obtains the characteristic of the low temperature coefficient. However, the SoC is just an embodiment which is not used to limit the scope of the present invention. If a high temperature coefficient circuit in any IC can be calibrated by means of a low temperature coefficient circuit deployed on the same IC such that the high temperature coefficient circuit can obtain the characteristic of the low temperature coefficient, then this IC also belongs to the scope of the present invention. FIG. 2 is a detailed circuit diagram of an embodiment of the IC 10 including two clock circuits, where the first circuit 11 includes a saw tooth clock generator 111 and a reference voltage circuit 112, the second circuit 12 is a digital control oscillator (DCO), and the calibration control circuit 13 includes a comparison circuit 131 and an adjustment circuit 132. In this embodiment, the main goal of the IC 10 is to provide a high-speed and almost temperature-independent clock signal. The IC 10 calibrates the high-speed but temperature-dependent clock circuit (i.e. the DCO 12) as having the characteristic of the low temperature coefficient, by using the low-speed, precise and almost temperature-independent clock circuit (i.e. the saw tooth clock generator 111).

Figure 3:
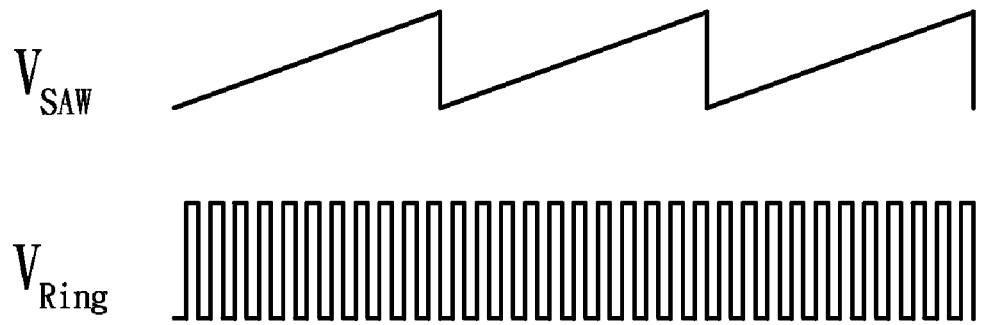
FIG. 3 shows the waveforms of $V_{SAW}$ and $V_{Ring}$.

In FIG. 2, the first circuit 11 is designed as having the low temperature coefficient. The reference voltage circuit 112 utilizes a bandgap circuit 1121 to generate a precise, nearly temperature-independent voltage $V_{BG}$, which passes through a negative feedback operational amplifier 1122 and a current mirror formed by transistors M1~M3, and generates in the saw tooth clock generator 111 a reference current $I_{REF}$ and a reference voltage $V_{REF}$, both of which are also precise and nearly temperature-independent. At the start, the switch 1111 is connected while the switch 1112 is disconnected. The reference current $I_{REF}$ charges the capacitor C1 (which is designed as having a low temperature coefficient) to generate the voltage $V_{SAW}$. When $V_{SAW}$ is larger than the reference voltage $V_{REF}$, the switches 1111 and 1112 would be disconnected and connected respectively such that the capacitor C1 is discharged to reset $V_{SAW}$. The above process is repeatedly performed such that the voltage $V_{SAW}$ forms a saw tooth clock as shown in FIG. 3. Since the saw tooth clock formed by the voltage $V_{SAW}$ is generated by the nearly temperature-independent reference current $I_{REF}$ passing through the low temperature coefficient capacitor C1 and has a low clock rate, the undesirable switching time resulted from the comparison of $V_{SAW}$ and $V_{REF}$ and the switching of the switches 1111 and 1112 can be ignored. Thus, to sum up all the features described above, the voltage $V_{SAW}$ outputted by the saw tooth clock generator 111 is a low-speed saw tooth clock with a low temperature coefficient.

The DCO 12 comprises a plurality of serially connected NOT gates. The voltage $V_{Ring}$ can form a high-speed clock signal (e.g. several hundred MHz) by switching between high and low repeatedly and rapidly. FIG. 3 shows the waveforms of the voltages of $V_{SAW}$ and $V_{Ring}$. Although the DCO 12 is power-saving and can operate at a higher frequency, it is very temperature-dependent. If a designer wants to design an almost temperature-independent DCO directly, the circuit complexity and thus the circuit area and power consumption would be increased substantially. Therefore, the embodiment of FIG. 2 utilizes the low-speed, almost temperature-independent saw tooth clock generator 111 to calibrate the high-speed, high temperature coefficient DCO 12 such that the IC 10 can generate a high frequency, low temperature coefficient clock output and at the same time maintain the small circuit area and low circuit power consumption.

The calibration control circuit 13 compares the first and second outputs according to the predefined relationship therebetween so as to generate the adjusting signal for adjusting the second circuit 12. In this embodiment, the first output is the voltage $V_{SAW}$ (i.e. the saw tooth clock signal) generated by the saw tooth clock generator 111, and the second output is the voltage $V_{Ring}$ (i.e. the digital clock signal) generated by the DCO 12. The comparison circuit 131 of the calibration control circuit 13 is coupled to the saw tooth clock generator 111 and the DCO 12 respectively, and compares the saw tooth clock signal $V_{SAW}$ and the digital clock signal $V_{Ring}$ to generate a comparison result to the adjustment circuit 132. The adjustment circuit 132 then generates the adjusting signal for adjusting the frequency of the DCO 12 according to the comparison result. In one embodiment, the comparison circuit 131 includes a counter for counting clock numbers of the saw tooth clock signal and the digital clock signal during a time period for comparison. For instance, assume that the saw tooth clock rate is 1 MHz and the digital clock rate is 125 MHz, i.e. the predefined relationship between the saw tooth clock and the digital clock is a proportional relationship of 1:125. If the saw tooth clock counts 100 times, then the digital clock should counts 12500 times in a normal condition. If the saw tooth counts 100 times while the digital clock counts more than 12500 times, then the digital clock rate needs lowering; on the contrary, if the saw tooth counts 100 times while the digital clock counts less than 12500 times, then the digital clock rate needs increasing. The comparison circuit 131 provides the comparison result to the adjustment circuit 132, which would generate the adjusting signal corresponding to the required scale of increasing or lowering the digital clock rate. The adjusting signal can include a multi-bit digital code for indicating different increasing or lowering scale. When receiving the adjusting signal, the DCO 12 would correspondingly adjust the output digital clock rate according to the digital code included in the adjusting signal.

The embodiment of FIG. 2 can be extended to the IC having more than two clock generators. In this situation, the outputs of these clock generators are respectively compared with the saw tooth clock generated by the saw tooth clock generator 111 according to other predefined relationships, so as to generate different adjusting signals for calibration. In this manner, multiple almost temperature-independent clock signals can be provided at the same time without substantially increasing the circuit area and power consumption.

Figure 4:
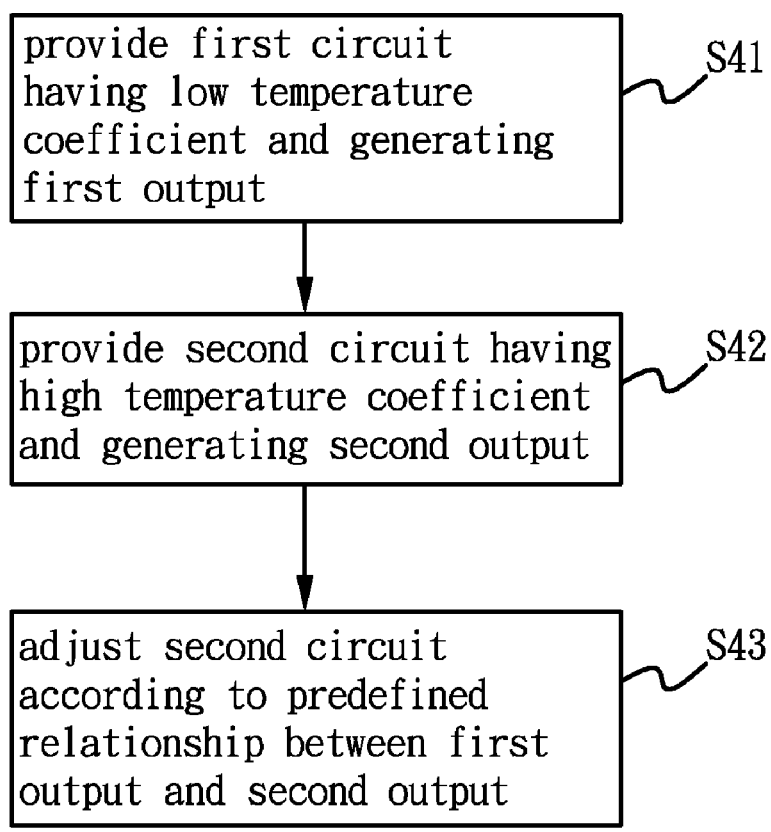
FIG. 4 is a flowchart of an embodiment of the calibration method used in an integrated circuit according to the present invention.

FIG. 4 is a flow chart of an embodiment of the calibration method used in an IC according to the present invention. The IC can be a SoC. In step S41, a first circuit having a low temperature coefficient is provided, where the first circuit generates a first output. In step S42, a second circuit having a high temperature coefficient is provided, where the second circuit generates a second output. In step S43, the second circuit is adjusted according to a predefined relationship between the first and second outputs such that the second circuit can have the characteristic of the low temperature coefficient.

In one embodiment, the first output is a saw tooth signal, and the second output is a digital clock signal. Thus, step S43 includes: comparing the saw tooth clock signal and the digital clock signal according to the predefined relationship to generate an adjusting signal; and adjusting a frequency of the second circuit according to the adjusting signal. In the above comparing step, the adjusting signal can be generated by counting and comparing clock numbers of the saw tooth clock signal and the digital clock signal during a time period.

The IC and the associated calibration method of the present invention can make most circuits in the IC obtain the characteristic of the low temperature coefficient without increasing the cost of design and manufacture, thereby reaching a balance between the request of lowering the temperature coefficient and the cost issue.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. A calibration method of an integrated circuit comprising steps of:
    providing a first circuit which has a first temperature coefficient and generates a first output, wherein the first output is a low-speed saw tooth clock signal generated by a temperature independent reference current through a low temperature coefficient capacitor;
    providing a second circuit which has a second temperature coefficient and generates a second output; and
    adjusting the second circuit according to a predefined relationship between the first output and the second output to make the second circuit to have a characteristic of the first temperature coefficient;
    wherein the first temperature coefficient is lower than the second temperature coefficient.

2. The calibration method of claim 1, wherein the first circuit and the second circuit are deployed on a same chip substrate.

3. The calibration method of claim 1, wherein the second output is a digital clock signal.

4. The calibration method of claim 3, wherein the step of adjusting the second circuit comprises:
    comparing the saw tooth clock signal and the digital clock signal according to the predefined relationship to generate an adjusting signal; and
    adjusting a frequency of the second circuit according to the adjusting signal.

5. The calibration method of claim 4, wherein the step of comparing the saw tooth clock signal and the digital clock signal comprises counting clock numbers of the saw tooth clock signal and the digital clock signal during a time period.

6. An integrated circuit comprising:
    a first circuit having a first temperature coefficient and generating a first output, wherein the first circuit is a saw tooth clock generator and wherein the first output is a low-speed saw tooth clock signal generated by a temperature independent reference current through a low temperature coefficient capacitor;
    a second circuit having a second temperature coefficient and generating a second output; and
    a calibration control circuit, coupled to the first circuit and the second circuit, comparing the first output and the second output according to a predefined relationship therebetween, so as to generate an adjusting signal;
    wherein the first temperature coefficient is lower than the second temperature coefficient, and the adjusting signal adjusts the second circuit and makes the second circuit to have a characteristic of the first temperature coefficient.

7. The integrated circuit of claim 6, wherein the first circuit and the second circuit are deployed on a same chip substrate.

8. The integrated circuit of claim 7, wherein the calibration control circuit is deployed on the same chip substrate.

9. The integrated circuit of claim 6, wherein the second circuit is a digital control oscillator, and the second output is a digital clock signal.

10. The integrated circuit of claim 9, wherein the calibration control circuit comprises:
    a comparison circuit, comparing the saw tooth clock signal and the digital clock signal according to the predefined relationship to generate a comparison result; and
    an adjustment circuit, coupled to the comparison circuit, generating the adjusting signal according to the comparison result, wherein the adjusting signal comprises a multi-bit digital code used for adjusting a frequency of the digital control oscillator.

11. The integrated circuit of claim 10, wherein the comparison circuit comprises a counter.

12. An integrated circuit comprising:
    a saw tooth clock generator having a first temperature coefficient, the saw tooth clock generator being configured to generate a low-speed saw tooth clock output generated by a temperature independent reference current through a low temperature coefficient capacitor;
    a clock circuit having a second temperature coefficient and configured to generate a second clock output; and
    a calibration control circuit coupled to the saw tooth clock generator and the second circuit, the calibration control circuit configured to generate an adjusting signal by comparing the low-speed saw tooth clock output and the second clock output according to a predefined relationship between the low-speed saw tooth clock output and the second clock output;
    wherein the first temperature coefficient is lower than the second temperature coefficient.

* * * * *